United States Patent
Nikkhoo et al.

(10) Patent No.: US 12,453,050 B1
(45) Date of Patent: Oct. 21, 2025

(54) HEAT PIPE INCLUDING AN INTEGRATED ANTENNA

(71) Applicant: Meta Platforms Technologies, LLC, Menlo Park, CA (US)

(72) Inventors: Michael Nikkhoo, Saratoga, CA (US); Vivek Sahu, San Diego, CA (US); Brian Toleno, Cupertino, CA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 382 days.

(21) Appl. No.: 18/071,387

(22) Filed: Nov. 29, 2022

(51) Int. Cl.
*H05K 7/20* (2006.01)

(52) U.S. Cl.
CPC ..... *H05K 7/20336* (2013.01); *H05K 7/20309* (2013.01); *H05K 7/20318* (2013.01)

(58) Field of Classification Search
CPC .. H05K 7/20; H05K 7/20145; H05K 7/20154; H05K 7/20254; H05K 7/20309–20318; H05K 7/20336; H05K 7/2039–20518; H05K 7/20436; H05K 7/20445; H05K 7/205; H05K 7/20945; H05K 7/20963; H05K 7/2099; H01L 23/427; H01L 23/46; H01L 23/473; H01L 23/31; H01L 23/34; H01L 23/36; H01L 23/3733; H01L 23/3737; G02B 27/0176; G02B 27/0178; G02B 1/04; G06F 1/163; G06F 1/203; G06F 1/206; G06F 1/1637; G06F 1/1681
See application file for complete search history.

(56) References Cited

U.S. PATENT DOCUMENTS

| | | | |
|---|---|---|---|
| 9,740,023 B1* | 8/2017 | Ashwood | G02C 11/10 |
| 10,823,969 B1* | 11/2020 | Hoover | H01M 10/653 |
| 11,515,617 B1* | 11/2022 | Ichitsubo | H03F 3/195 |
| 12,032,171 B1* | 7/2024 | Nikkhoo | G02C 5/22 |
| 12,111,514 B1* | 10/2024 | Ashwood | G02C 11/10 |
| 2004/0244397 A1* | 12/2004 | Kim | G06F 1/203 |
| | | | 62/259.2 |
| 2016/0157372 A1* | 6/2016 | Hiroki | G06F 1/1637 |
| | | | 361/679.01 |
| 2016/0212879 A1* | 7/2016 | Nikkhoo | H05K 7/20127 |
| 2018/0372424 A1* | 12/2018 | Hurbi | F28D 20/025 |
| 2019/0128937 A1* | 5/2019 | Choi | G06F 1/1698 |
| 2021/0015002 A1* | 1/2021 | Cheng | H05K 7/20336 |
| 2022/0294100 A1* | 9/2022 | Zhang | H01Q 15/0066 |
| 2023/0096345 A1* | 3/2023 | Lewis | A45C 11/00 |
| | | | 361/688 |
| 2023/0099937 A1* | 3/2023 | Jadidian | H01Q 1/364 |
| | | | 343/718 |
| 2023/0380111 A1* | 11/2023 | Lee | H04M 1/026 |
| 2024/0196550 A1* | 6/2024 | Cho | G06F 1/1624 |

* cited by examiner

*Primary Examiner* — Amir A Jalali
(74) *Attorney, Agent, or Firm* — McDermott Will & Schulte LLP

(57) ABSTRACT

A polyimide-based heat pipe is described. In examples, the heat pipe may include a first substrate including raised features on a surface of the substrate. In examples, the first substrate is covered with a second substrate or cover. At least the second substrate comprises polyimide. An outer surface of the heat pipe, e.g., the second substrate, includes one or more antennas disposed thereon.

20 Claims, 13 Drawing Sheets

400

PROVIDE A HEAT PIPE COMPRISING POLYIMIDE
402

CREATE AN ANTENNA PORTION
404

DISPOSE THE ANTENNA PORTION ON AN OUTER SURFACE OF THE HEAT PIPE
406

FIG. 4

HEAT PIPE INCLUDING AN INTEGRATED ANTENNA

BACKGROUND

The efficiency of passive thermal solution is directly dependent on the available surface area for heat rejection. A typical wearable device will have many radio frequency (RF) communications modes and require multiple antennas. All these antennas radiate energy outside the device. Traditional thermal solutions interfere with antenna signals and cannot be placed near the vicinity of the RF antennas. This restricts the allocated space for a thermal solution in wearable devices. This becomes an even more serious concern as wearable devices have a small form factor and RF and thermal both compete for the limited surface area that is available.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIG. 4 illustrates a flow diagram of an example method that illustrates aspects of techniques in accordance with examples as described herein.

DETAILED DESCRIPTION

Overview

Figure 1A:
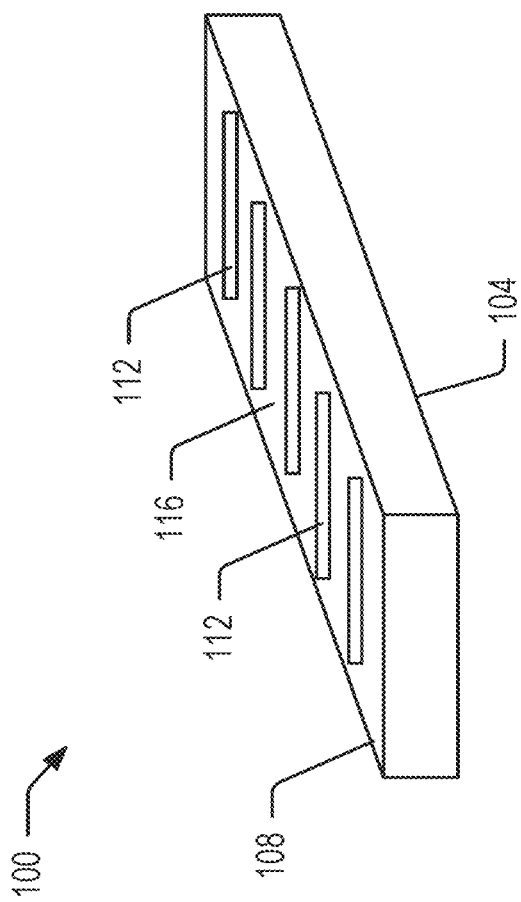
FIGS. 1A-1D schematically illustrate example heat pipes, in accordance with examples of the present disclosure.

The techniques, systems, and arrangements described herein provide simplified unique heat pipe fabrication techniques, whereby wettability of heat pipes that are polyimide-based and include one or more antennas.

This application describes heat pipes, vapor chambers, thermal spreaders, and other thermal solutions and heat dissipating apparatuses (collectively referred to herein as "heat pipes") that are transparent to antenna signals. In some examples, the heat pipes can be made of polyimide or other materials which are RF friendly (e.g., do not significantly interfere with RF signals) in a range of operating frequencies. Because the heat pipes are transparent to antenna signals, thermal solutions and antennas may occupy the same, overlapping, and/or proximate space in an electronic device without impeding each other's performance. For example, for particular configurations of devices that include a thermal spreader, a thermal spreader area of a typical heat pipe may need to be reduced by more than 20% due to interference with an antenna signal. However, an RF compliant thermal spreader as described herein may be is able to utilize the whole surface area, thus effectively increasing the available space by 20%.

Furthermore, in configurations antenna patterns may be disposed on top of outer surfaces of polyimide layers of the heat pipe, thus integrating the antenna directly with a thermal solution. In such configurations, the outer surface of the heat pipe may act as a radiating surface for the antenna. This may also increase the available surface area for both the thermal properties of the heat pipe and the antenna as they do not have to compete with each other for space within a device. An integrated thermal/RF solution may free up the space that may then be utilized by other subsystems of a device. Additionally, polyimide-based heat pipes provide weight savings based upon the use of the lighter materials and improved RF performance due to reduced interference with a device's antennas.

In examples, a heat pipe may include a first substrate comprising a plurality of raised features on a surface of the first substrate, an evaporator portion, and a condenser portion. In examples, the heat pipe further includes a second substrate bonded to the first substrate, a working fluid between the first substrate and the second substrate, and the antenna disposed on the outer surface on one of the first substrate or the second substrate. In examples, at least one of the first substrate or the second substrate comprises polyimide.

In some examples, the heat pipe further includes a dielectric material on the heat pipe and the antenna is disposed on the dielectric material. In examples, the dielectric material comprises polythene. In some examples, the dielectric material comprises polypropylene.

In some examples, the antenna comprises a radio frequency (RF) compatible thin film.

In some examples, the heat pipe further includes one or more stiffening layers on portions of the heat pipe, wherein the antenna is disposed on the one or more stiffening layers. In some examples, the one or more stiffening layers comprise polythene. In some examples, the one or more stiffening layers comprise polypropylene.

In examples, a wearable device includes at least one heat pipe, the at least one heat pipe including a first substrate including a plurality of raised features on a surface of the first substrate, an evaporator portion, and a condenser portion. In examples, the heat pipe further includes a second substrate bonded to the first substrate, a working fluid between the first substrate and the second substrate, and the antenna disposed on the outer surface on one of the first substrate or the second substrate. In examples, at least one of the first substrate or the second substrate comprises polyimide.

In some examples, the heat pipe further includes a dielectric material on the heat pipe and the antenna is disposed on the dielectric material. In examples, the dielectric material comprises polythene. In some examples, the dielectric material comprises polypropylene.

In some examples, the antenna comprises a radio frequency (RF) compatible thin film.

In some examples, the heat pipe further includes one or more stiffening layers on portions of the heat pipe, wherein the antenna is disposed on the one or more stiffening layers. In some examples, the one or more stiffening layers comprise polythene. In some examples, the one or more stiffening layers comprise polypropylene.

In examples, a method may include providing a heat pipe comprising polyimide. In examples, the method may further include disposing an antenna on the heat pipe.

In some examples, disposing the antenna on the heat pipe may include printing the antenna on an outer surface of the heat pipe. In other examples, disposing the antenna on the heat pipe may include laminating the antenna on an outer surface of the heat pipe. In some examples, disposing the antenna on the heat pipe includes chemically etching the antenna into an outer surface of the heat pipe.

In examples, prior to disposing the antenna on the heat pipe, the method may include disposing a dielectric material on the heat pipe. In such examples, disposing the antenna on the heat pipe may include disposing the antenna on the dielectric material. In some examples, the dielectric material comprises polythene. In some examples, the dielectric material comprises polypropylene.

In some examples, the method may further include creating an antenna portion. In such examples, creating an antenna portion may include providing a radio frequency (RF) compatible thin film and disposing an antenna on the RF compatible thin film. In such examples, disposing the antenna on the heat pipe may include attaching the antenna portion on an outer surface of the heat pipe.

In some examples, disposing the antenna on the RF compatible thin film may include printing the antenna on an outer surface on the RF compatible thin film. In other examples, disposing the antenna on the RF compatible thin film may include laminating the antenna on a surface of the RF compatible thin film. In some examples, disposing the antenna on the RF compatible thin film may include chemically etching the antenna into a surface of the RF compatible thin film.

In examples, the method may further include, prior to disposing the antenna on the heat pipe, disposing one or more stiffening layers on portions of the heat pipe. In such examples, disposing the antenna on the heat pipe may include disposing the antenna on the one or more stiffening layers. In some examples, the one or more stiffening layers may comprise polythene. In some examples, the one or more stiffening layers may comprise polypropylene.

Example Embodiments

FIG. 1A schematically illustrates an example heat pipe 100 that comprises a first substrate 104 and a second substrate (cover) 108. In examples, at least the second substrate 108 comprises polyimide. One or more antennas 112 may be disposed on an outer or top surface of the second substrate 108. In examples, features (not shown in FIG. 1A) may be formed on the first substrate 104, as will be described herein. While four antennas 112 are illustrated in the example of FIG. 1A, more antennas 112 or fewer antennas 112 may be included depending on the configuration of the heat pipe 100. Additionally, the antennas 112 may have different shapes than the rectangles illustrated in the example of FIG. 1A. Also, one or more of the individual antennas 112 may be coupled together to form an array.

In some embodiments, the first substrate 104 also comprises polyimide. In some examples, one or more antennas (not shown) may be disposed on an outer or top surface of the first substrate 104, in addition to, or instead of, the one or more antennas 112 be disposed on the outer or top surface of the first substrate 104.

In some examples, the one or more antennas 112 on the heat pipe 100 may be printed on an outer surface 116 of the heat pipe 100, e.g., on the second substrate 108. In other examples, the one or more antennas 112 on the heat pipe 100 may be laminated on the outer surface 116 of the heat pipe 100. In some examples, the one or more antennas 112 on the heat pipe 100 may be chemically etched into the outer surface 116 of the heat pipe 100.

Figure 1B:
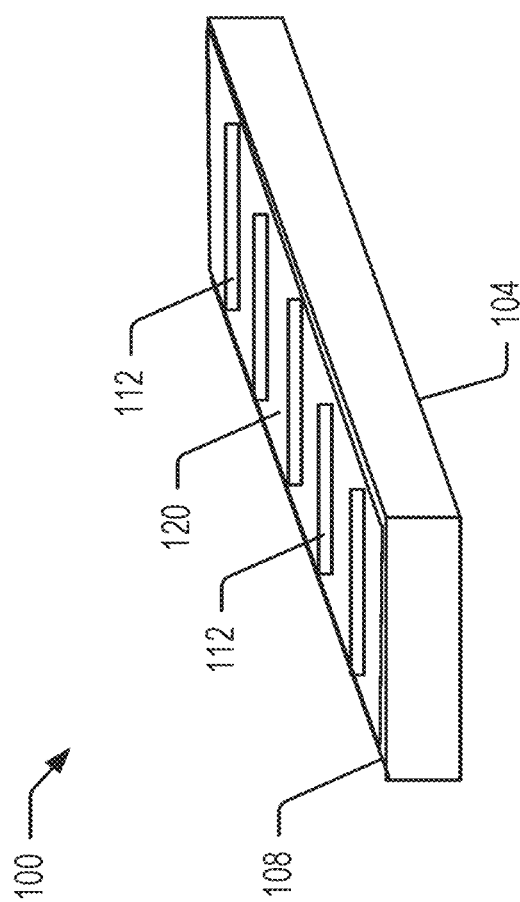

Referring to FIG. 1B, in examples, a dielectric material 120 may be disposed on the heat pipe 100, e.g., the outer surface 116 of the second substrate 108. In such examples, the one or more antennas 112 on the heat pipe 100 may be disposed on the dielectric material 120. In examples, the dielectric material 120 is radio frequency (RF) compatible, e.g., non-lossy, to help improve the RF compatibility of the second substrate 108. In some examples, the dielectric material 120 comprises polythene. In some examples, the dielectric material 120 comprises polypropylene.

Figure 1C:
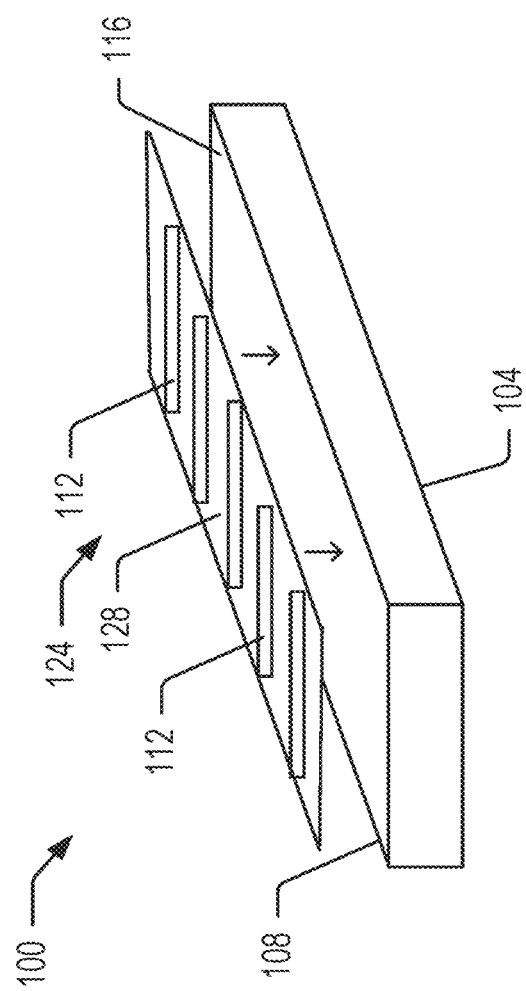

Referring to FIG. 1C, in some examples, an antenna portion 124 that includes one or more antennas 112 may be created. In such examples, the antenna portion 124 may include providing a radio frequency (RF) compatible thin film 128 and disposing the one or more antennas 112 on the RF compatible thin film 128. In such examples, the antenna portion 124 may be attached to the outer surface 116 of the heat pipe 100, e.g., the outer surface 116 of the second substrate 108.

In some examples, the one or more antennas 112 may be disposed on the RF compatible thin film 128 by printing the one or more antennas 112 on a surface of the RF compatible thin film 128. In other examples, the one or more antennas 112 may be disposed on the RF compatible thin film 128 by laminating the one or more antennas 112 on the RF compatible thin film 128 on a surface of the RF compatible thin film 128. In some examples, the one or more antennas 112 may be disposed on the RF compatible thin film 128 by chemically etching the one or more antennas 112 into a surface of the RF compatible thin film 128.

Figure 1D:
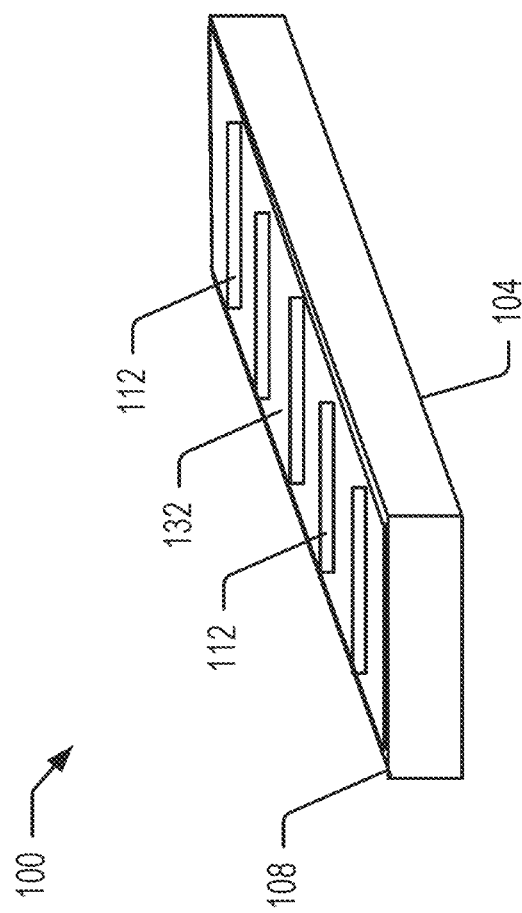

Referring to FIG. 1D, in examples, one or more stiffening layers 132 may be disposed on at least portions of the heat pipe 100, e.g., at least portions of the outer surface 116 of the second substrate 108 (or the entire outer surface 116 of the second substrate 108). In such examples, the one or more antennas may be disposed on the one or more stiffening layers 132. In some examples, the one or more stiffening layers 132 may comprise polythene. In some examples, the one or more stiffening layers 132 may comprise polypropylene.

Figure 2A:
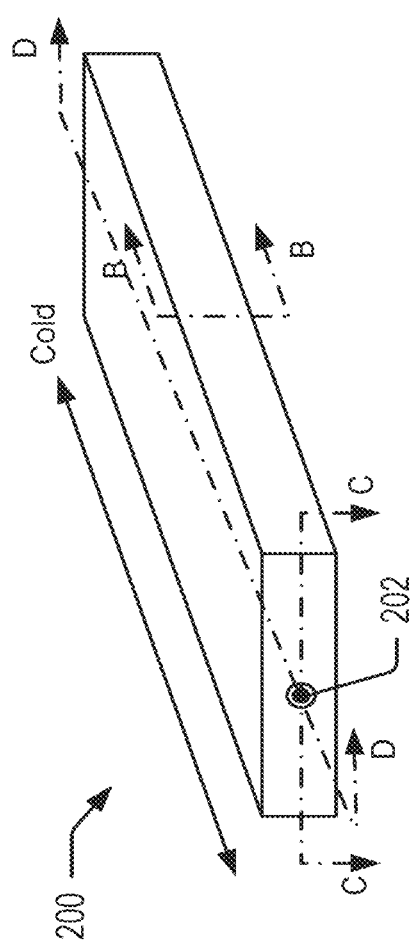
FIGS. 2A-2C are simplified schematic diagrams of examples of heat pipes and processes of manufacturing the same in accordance with examples of the present disclosure.
Figure 2B:
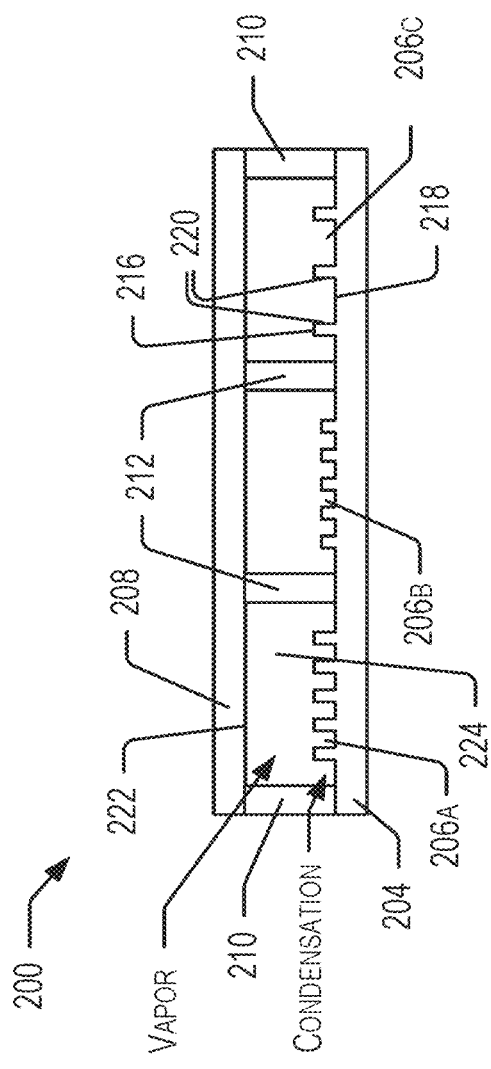
Figure 2C:
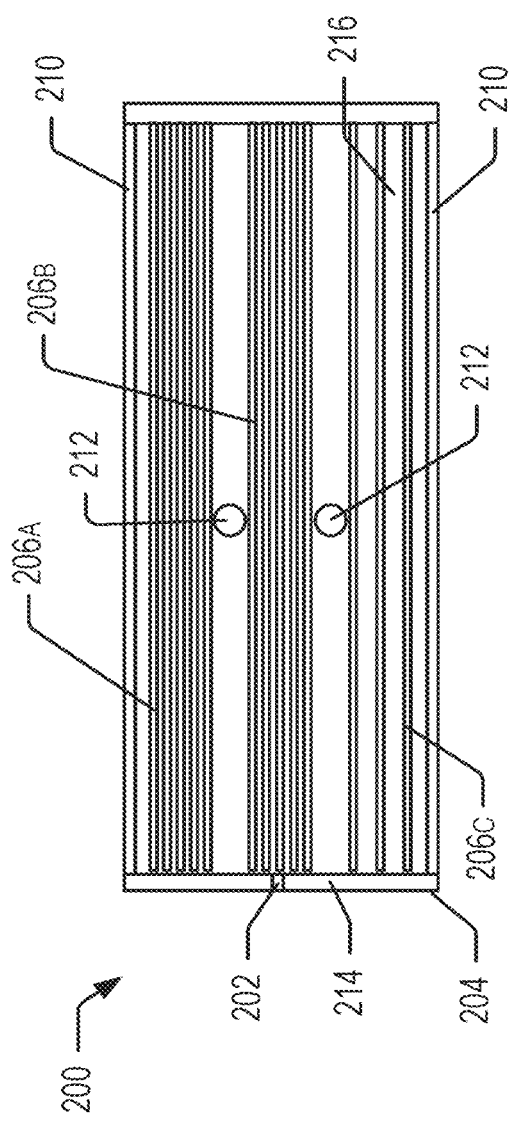

FIGS. 2A-2C illustrate an example heat pipe 200, e.g., example heat pipe 100 of FIGS. 1A-1D. This is merely an example and the techniques described herein are applicable to other sizes, shapes and configurations of heat pipes and/or vapor chambers.

In examples, the heat pipe 200 may include a substantially rigid, light weight structural element. While shown as a substantially planar substrate, the heat pipe 200 may be sized and shaped to any desired dimensions for a given design architecture. The heat pipe 200 may be employed as a core structure to which one or more electronic components of an electronic device may be directly or indirectly coupled.

FIG. 2A is a perspective view illustrating the example heat pipe 200 as an elongated substrate or rectangular prism. However, the heat pipe 200 can be sized and shaped to any desired dimensions for a given design architecture. By way of example and not limitation, heat management components may be elongated, arcuate, curved with continuous or variable radii, substantially planar substrates. As shown, the heat pipe 200 may be generally configured to transmit heat from a heat source (labeled "Hot") to a cooler end or portion (labeled "Cold"). In examples, additional heat dissipation may be provided by heat transfer to ambient environment, a cooling block, a heat sink, or any other cooling structure. In the case of an electronic device, the "Hot" end of the heat pipe 200 may in some examples be located in an internal portion of the electronic device housing, while the "Cold" end may contact or be proximate to an exterior of the device housing.

FIG. 2B is a cross-sectional view of the heat pipe 200 taken along line B-B in FIG. 2A. FIG. 2C is a cross sectional view of the heat pipe 200 taken along line C-C in FIG. 2A.

As shown, a first substrate 204 of the heat pipe 200 may include a wick/engine that may include at least in part one or more features such as grooves or channels 206A, 206B, and 206C formed therein by, for example, by laser ablation as described herein. In examples, the wick/Engine may be made of separate, polyimide, ceramic or glass (RF friendly) material and inserted into the heat pipe 200.

The configuration (e.g., size, shape, and relative spacing) of the grooves or channels may depend on the desired heat transfer characteristics of the heat pipe 200 and the working fluid to be used. In some examples, the configuration of the grooves or channels may be selected to tune the performance of the heat pipe 200 for a given application.

In examples, the one or more features such as grooves to channels 206A, 206B, and 206C may be designed to flow the working fluid between the condensation or "Cold" end of the heat pipe 200 and the evaporation or "Hot" end of the heat pipe 200.

In examples, a first substrate, e.g., first substrate 104 of FIGS. 1A-1D, may be provided onto which one or more features such as grooves or channels may be etched. In examples, the etching is performed via laser. In examples, the process may include laser ablation. In examples, the first substrate may be exposed to a laser to sublimate material from the first substrate and form one or more features such as grooves or channels.

In examples, one or more features may be formed only over a portion of the first substrate. In examples, one or more features may be formed over the whole surface of the first substrate. In examples, one or more features may be formed to extend along the full length of a surface of the first substrate. In examples, one or more features may be formed to extend only partially along a length of a surface of the first substrate. In examples, one or more features may extend partially along the length of a surface of the first substrate and other one or more features may extend along the full length of the surface of the first substrate.

In examples, as illustrated in FIG. 2C, one or more features may be formed to extend on the surface of a first substrate from one edge or end to the opposite edge or end. Illustrated in FIG. 2C the one or more features are shown as grooves or channels 206A, 206B, and 206C extend a length of the surface of first substrate 204 between the two endcaps 214.

In examples, a first substrate 204, e.g., first substrate 104 of FIGS. 1A-1D, may include polyimide. In examples, the first substrate 204 may have a surface roughness ranging between about 40 μm and 70 μm. In examples, the surface roughness of the first substrate 204 prior to laser ablation may be about 63 μm.

In examples, the laser ablation may be carried out using any suitable laser. In examples, the laser may be a fiber laser. In examples, the fiber laser may be a superfast laser, a very fast laser, or a fast laser. In examples, a superfast laser is a laser with a pulse in the femtosecond range, a very fast laser is a laser with a pulse in the picosecond range, and a fast laser is a laser with a pulse in the nanosecond range.

In examples, the laser may have a pulse ranging from 20 fs to 200 ns. In examples, the laser pulse may range from about 200 fs to about 20 ps. In examples, a picosecond pulse laser may exhibit pulse width or duration of less than 20 ps. In examples, a femtosecond pulse laser may exhibit a pulse width or duration below 1 ps, for example within the range of 20 fs to 999 fs. In examples, the femtosecond pulse laser may be about 20 fs, 30 fs, 40 fs, 50 fs, 60 fs, 70 fs, 80 fs, 90 fs, 100 fs, 200 fs, 300 fs, 400 fs, 500 fs, 600 fs, 700 fs, 800 fs, 900 fs, 950 fs, 999 fs or within a range defined by any two of these example values. In examples a picosecond pulse laser may exhibit a pulse width or duration as short as about 1 ps and as high as 999 ps. In examples, the picosecond pulse laser may be about 1 ps, 5 ps, 10 ps, 15 ps, 20 ps, 30 ps, 40 ps, 50 ps, 60 ps, 70 ps, 80 ps, 90 ps, 100 ps, 200 ps, 300 ps, 400 ps, 500 ps, 600 ps, 700 ps, 800 ps, 900 ps, 950 ps, 999 ps or within a range defined by any two of these example values. In examples, a nanosecond pulse laser may exhibit a pulse width or duration within the range of 1 ns and 200 ns. In examples, the nanosecond pulse laser may exhibit a pulse that is about 1 ns, 5 ns, 10 ns, 15 ns, 20 ns, 30 ns, 40 ns, 50 ns, 60 ns, 70 ns, 80 ns, 90 ns, 100 ns, 120 ns, 140 ns, 160 ns, 180 ns, 200 ns or within a range defined by any two of these example values.

In examples, the laser ablation may be carried out by modulating one or more of the feed rate, the laser power, the optics, the beam diameter, the peak power, and/or the duty cycle.

In examples, duty cycle when using a femtosecond pulse may be less than about 0.001%. In examples, the duty cycle when using a picosecond pulse may be less than about 1%. In examples, the duty cycle when using a nanosecond pulse may be less than about 10%.

In examples, the laser may have a power level within the range of 10 W to 20 W. In examples, the laser power level may be 10 W, 11 W, 12 W, 13 W, 14 W, 15 W, 16 W, 17 W, 18 W, 19 W, 20 W or within a range defined by any two of these example values.

In examples, the laser may have a spot diameter or spot size within the range of 15 μm to 50 μm. In examples, the laser may have spot size of 15 μm, 20 μm, 25 μm, 30 μm, 35 μm, 40 μm, 45 μm, 50 μm, or within a range defined by any two of these example values. In examples, the laser spot size is <30 μm. For purposes of this description, the spot diameter or spot size refers to the laser size as measured at the target, i.e. on the substrate to which it is directed.

In examples, the laser ablation may be carried out using a femtosecond pulse laser such as the Pharos femtosecond laser 15 W provided by Light Conversion with a power of 15 W at a wavelength of 1030 nm or a power of 3.75 W at a wavelength of 343 nm. In other examples, other wavelengths of lasers (higher or lower than the example provided) can be used. In examples, another laser that may be used includes the ILT 1500 laser provided by IPG Photonics Corporation.

In examples, the fine features may lead to a heat pipe with high performance. In examples, the dimensions, spacing, and/or geometry of the grooves or channels may affect the tendency of the working fluid to condense and/or may affect the capillary action of the grooves or channels.

In examples, the laser ablation may be carried out in multiple passes. In examples, a portion of the first substrate being patterned is removed with each pass. In examples, one or more laser sources may be used to form the one or more features. In examples, a single laser source may be used to form one or more features. In examples, multiple laser sources may be used to form one or more features. In examples, a laser source and/or the first substrate may be coupled to a robotic arm, track, and/or actuator that is able to move the laser source, the first substrate or a combination of both relative to each other. In examples, a deflecting mirror or like device may be used to split or redirect a laser to one or more portions of a first substrate surface to form one or more features.

In examples, with each pass a portion of the material of the first substrate is sublimated. In examples, the laser ablation is carried out until one or more features with a desired depth of a pattern are achieved. In examples, the laser ablation can be carried out to remove material at a linear inch rate of about 1 mm/s to 2 mm/s for each pass.

In examples, any desired feature pattern may be formed. In examples, one or more grooves or channels may be formed. In the examples, the features are grooves or channels. In examples, all grooves or channels formed may have the same shape, and profile dimensions. In the illustrated example, the grooves or channels 206A, 206B, and 206C are shown as being different heights/depths, spacings/pitches, and/or geometry. In some examples, the grooves or channels may be homogenous throughout the interior of the heat pipe 200 or may vary throughout the interior of the heat pipe 200, depending on the desired performance. In examples, the grooves formed may have different shapes and/or profile dimensions. In examples, a first groove may have the same or different depth than at least one second groove. In examples, a first groove may have the same or different shape and/or profile than at least one second groove. In examples, a groove shape may be a U-shape, a V-shape, or a squared shape. In examples, a groove or channel may have perpendicular or slanted sidewalls 220. In examples, a groove or channel may be free of undercut.

In examples, the surface of a feature or portion of a feature may be smooth or rough. For example, the surface of a groove or channel sidewalls 220 and/or groove or channel bottom portion 218 formed by the laser ablation may be smooth or rough. In examples, one or more surfaces of a feature may be the same or different from one or more other surfaces of the feature. For example, the surface of a groove or channel sidewalls 220 formed by the laser ablation may have the same or different characteristics than the groove or channel bottom portion 218 that was also formed by laser ablation.

In examples, the surface 216 of the first substrate between features such as between grooves or channels 206A, 206B, and 206C may be flat, curved, smooth, rough, or any combination thereof. In examples, the surface 216 of the substrate between features may be flat. In examples, a flat top surface 216 between features such as grooves or channels can be desirable when also adding a wick layer structure as described later.

In examples, the profile of a feature may have any desired size. In examples, a groove or channel may be formed of any desired width and depth. In examples, a groove or channel may have a flat bottom portion 218 and two sidewalls 220 extending vertically from the bottom portion 218. In examples, the sidewalls 220 may be perpendicular to the bottom portion 218. In examples, the sidewalls 220 may be non-perpendicular to the bottom portion 218. In examples, the width of a feature such as groove or channel, as measured at the surface of the bottom portion 218, may be in the range of about 10 μm to 200 μm. In examples, the width of a features such as a groove or channel, measured at the surface of the bottom portion 218 of the groove or channel, may be about 50 μm. In examples, the width of a feature such as a groove or channel, measured at the surface of the bottom portion 218 of the groove or channel may be about 10 μm, 20 μm, 30 μm, 40 μm, 50 μm, 60 μm, 70 μm, 80 μm, 90 μm, 100 μm, 125 μm, 150 μm, 175 μm, 200 μm, or within a range defined by any two of these examples.

In examples, the depth of a features such as a groove or channel, measured from where the sidewall 220 of the groove or channel meets the bottom portion 218 of the groove or channel to the opposite, top end of a groove or channel sidewall 220 may be in the range of about 10 μm to 200 μm. In examples, the depth of a feature such as a groove or channel, measured from where the sidewall 220 of the groove or channel meets the bottom portion 218 of the groove or channel to the opposite, top end of a groove or channel sidewall 220 may be about 50 μm. In examples, the depth of a feature such as a groove or channel, measured from where the sidewall 220 of the groove or channel meets the bottom portion 218 of the groove or channel to the opposite, top end of a groove or channel sidewall 220 may be about 10 μm, 20 μm, 30 μm, 40 μm, 50 μm, 60 μm, 70 μm, 80 μm, 90 μm, 100 μm, 125 μm, 150 μm, 175 μm, 200 μm, or within a range defined by any two of these examples.

In examples, the feature pitch, or spacing measured at the surface 216 of the first substrate between features such as groove or channels can be of any desired size. In examples, the feature pitch of the grooves or channels may be within range of about 10 μm to 200 μm. In examples, the feature pitch may be about 50 μm. In examples, the feature pitch may be about 10 μm, 20 μm, 30 μm, 40 μm, 50 μm, 60 μm, 70 μm, 80 μm, 90 μm, 100 μm, 125 μm, 150 μm, 175 μm, 200 μm, or within a range defined by any two of these examples.

In examples, the width, depth, and pitch of any one feature may be the same or different from that of another feature. In examples, the groove or channel width, depth, and pitch may be all the same. For example, the groove or channel width, depth, and pitch may each be 50 μm. In examples, at least two of the groove or channel width, depth, and pitch may be different from each other.

In examples, the roughness of the surface of at least a portion of a feature formed by laser ablation may be in the range of about 3 μm to 10 μm. In examples, post laser ablation the roughness of the surface of at least a portion of a feature may be in the range of 1/10 to 1/5 of the feature dimensions. For examples, in examples where the groove or channel has a width as defined above of about 50 μm, the roughness at the surface of the bottom portion of the groove or channel may be within the range of 5 μm to 10 μm. In examples, the roughness of the surface of at least a portion of a feature achieved with laser ablation may be in the range of 3 μm to 5 μm.

In examples, by employing laser ablation as described, it may be possible to achieve more accurate feature patterning than by way of wet etching. Also, in examples, the laser ablation may avoid undercut for example where the sidewalls 220 of a groove or channel meet the surface of the bottom portion 218 of the groove or channel. In examples, using laser ablation it may be possible to more easily adjust a feature depth. For example, the depth of a groove or channel may be more easily adjusted using laser than wet etching. In examples, as shown in FIG. 2B, by laser ablation it may be possible to efficiently form feature, such as groove or channels, of varying depths, widths, and shapes on a substrate. This may lead to more design flexibility that may allow a manufacturer to achieve an effective design for a particular heat pipe or vapor chamber.

In examples, as described earlier, the design and shape of a feature such as a groove or channel on a substrate may materially affect the capillary limit and thin film evaporation. Accordingly, design flexibility provided by the laser ablation process as described, may result in a heat pipe with improved functionality as compared to a device formed by wet etching.

In examples, the surface roughness of the first substrate 204 with the one or more features patterned thereon may be further modified after laser ablation to improve capillary limit.

In examples, the laser ablated surface may optionally be exposed to a caustic solution to achieve microetching and further increase surface roughness if desired. In examples, the caustic solution may include hydrofluoric acid, potassium hydroxide or the like. In examples, the process may be carried out at room temperature for about 20 min to 40 min. In examples, exposure to a caustic solution may result in increased roughness by about 1 µm to 2 µm. In examples, the caustic solution process is omitted so as to avoid the employment of one or more polluting chemicals.

In examples, surfaces of the first substrate 204 may be oxidized. In examples, the ablated first substrate 204, which as earlier described may for example be a polyimide substrate, may be oxidized in a heated, oxidizing atmosphere. In examples, the oxidation may be carried out after the laser ablation. In examples, no additional treatment of the laser ablated surface occurs prior to the oxidation. In examples by the optional exposure to caustic solution is carried out to increase surface roughness of the laser ablated surface, the oxidation may be carried out after completion of the optional caustic solution process.

In examples, the oxidizing atmosphere may include oxygen. In examples, the oxidizing atmosphere by include pure oxygen. In examples, the oxidizing atmosphere by include air.

In examples, the oxidation may be carried out by exposing at least portion of the surface of one or more features to an oxidizing atmosphere at a temperature ranging from about 450° C. and 700° C. In examples, the temperature of the oxidation may be about 450° C., 475° C., 500° C., 525° C., 550° C., 575° C., 600° C., 625° C., 650° C., 675° C., 700° C., or within a range defined by any two of these examples.

In examples, the oxidation may be carried out for a period of time ranging from about 1 hr to 3 hr. In examples, the oxidation is carried out for about 60 min, 75 min, 90 min, 105 min, 120 min, 135 min, 150 min, 165 min, 180 min, or within a range defined by any two of these examples.

In examples, where the first substrate 204 is polyimide, the oxide formed over the surface of the ablated first substrate may include rutile, anatase, or both. In examples, the oxide may be formed over at least a portion of one or more features formed in the first substrate. For example, the oxide may be formed at least over the surface of the bottom portion 218 of the groove or channel formed in the ablated first substrate. In examples, the oxide may be formed over the sidewalls 220 of the grooves or channels in the ablated first substrate. In examples, the oxide may be formed over the surface of the first substrate that is between features such as grooves or channels. In examples, the oxide may be formed over any one or more of the surfaces of the first substrate between and over the features. For examples, the oxide may be formed over any one or more of the surfaces of the first substrate between grooves or channels, at a bottom portion 218 of the grooves or channels, and on one or more sidewalls 220 of the grooves or channels.

In examples, the oxide formed through the oxidation may be a native oxide. In examples, the oxide may have a thickness from the nanometer to the submicron range. In examples, the oxide may have a thickness ranging from about 5 nm to 1 µm. In examples, the oxide formed may have a thickness of about 1 µm, 2 µm, 3 µm, 5 µm, 10 µm, 20 µm, 40 µm, 60 µm, 80 µm, 1 nm, 1.25 nm, 1.5 nm, 1.75 nm, 2 nm, 2.5 nm, 3 nm, 3.5 nm, 4 nm, 4.5 nm, 5 nm, or within a range defined by any two of these examples.

In examples, the oxidation can increase the surface roughness and/or affect the surface energy. In examples, oxidation may increase surface roughness by about 1 µm or less. In examples, oxidation may increase surface energy and thus decrease the standing water contact angle thus making the surface more hydrophilic.

In examples, the surface oxidation may be followed by a surface chemical treatment. In examples, the same or different portions of the surface of the first substrate 104 may be subjected to the surface chemical treatment. In examples, the surface chemical treatment may induce a chemical conversion over the oxide formed during oxidation. In examples, the chemical conversion may result in a coating or film formed over the surface of the oxide. In examples, the coating or film may have a thickness of a few atomic layers. In examples, the coating or film may include a fluorosilane. In examples, the surface chemical treatment may affect the hydrophobicity and/or hydrophilicity of at least a portion of the surface of the first substrate.

In examples, the surface chemical treatment may include a chemical treatment in which at least a portion of the surface of the first substrate including one or more features may be exposed to one or more fluorinated compounds. In examples, the surface chemical treatment may include treatment in which at least a portion of the surface of the first substrate including one or more features may be exposed to one or more silanes or other chemical compound able to react with the substrate surface to form stable covalent bonds and possess an organic substitution that alters the physical interactions of treated substrates. In examples, where the features are grooves or channels, the inner and/or outer portions of the grooves or channels formed by laser may be exposed to the chemical treatment.

In examples, the chemical treatment may include exposure to one or more hydrophobic silanes selected from a methyl, linear or branched alkyl, a fluorinated alkyl, an aryl, or a dipodal silane, and/or to one or more hydrophilic silanes selected from a polar silane, an hydroxylic silane, an ionic silane, a charge inducible silane, a silane with embedded hydrophilicity, or a masked silane. In examples, the chemical treatment may include exposure to a chelating complexing agent, for example a chelating silane complexing agent. In examples, the chemical treatment may include exposure to a fluorinated species and/or to a fatty acid.

In examples, the surface chemical treatment may be carried out at approximately room temperature for a period of 30 min to 60 min.

In examples, different portions of the first substrate and/or features may be subject to different degrees of exposure of the same chemical treatment. In examples, different portions of the first substrate and/or features may be exposed to different chemicals to achieve differing surface chemical treatments for different portions of the surface of the first substrate and/or features.

In examples, the first substrate has been laser ablated and oxidized as previously described. In examples, the portion of the first substrate exposed to the surface chemical treatment may include at least an inner portion of the ablated grooves or channels. In examples, at least a portion of the surface of the bottom portion 218 of the grooves or channels may be exposed to the surface chemical treatment.

In examples, the portion of the first substrate surface that is configured to be located on the "Hot" side of the heat pipe may be chemically treated differently from the portion of the substrate surface that is configured to be located on the "Cold" side of the heat pipe or vapor chamber, where the "Hot" and "Cold" sides refer to the evaporation portion and condensation portions of the heat pipe as previously described. In examples, the surface chemical treatment is omitted on the evaporation portion. In examples, only the condensation portion may be exposed to the surface chemical treatment.

In examples, one or more masking steps may be used to expose different portions of a substrate surface to the surface chemical treatment in different manners. In examples, a lithography mask may be used to cover at least a portion of the substrate surface while at least a second portion of the substrate surface is exposed to the surface chemical treatment. In examples, lithography masks may be deposited and removed over different portions of the substrate surface to enable selective surface chemical treatment of different portions of the substrate surface and/or controlled exposure of different portions of the substrate surface to a surface chemical treatment.

In examples, surface chemical treatment of a substrate surface may be carried out to enhance hydrophobicity of a first portion of the first substrate or feature surface. In examples, the portion of the first substrate or feature surface that is intended to be located on the condensation side of the heat pipe may be exposed to a surface chemical treatment to enhance its hydrophobic characteristics. In examples, the portion of the first substrate or feature surface that is intended to be located on the evaporation side of the heat pipe may left untreated to preserve its hydrophilicity. In examples, exposure to surface chemical treatment may be limited over the portion of the first substrate or feature surface that is intended to be located on the evaporation side of the heat pipe so as to preserve or modify its hydrophilic characteristics.

In examples, the surface chemical treatment may be able to enhance hydrophobicity of the first substrate surface by affecting the static water contact angle. For purposes of this description, a surface with a static water contact angle greater than 90° may be considered hydrophobic, while a surface with a static water contact angle lower than 90° may be considered hydrophilic. A contact angle goniometer or similar device as known in the art may be used to determine the static water contact angle.

In examples, the surface chemical treatment used to enhance hydrophobic characteristics, such as for example on the surface of the first substrate and/or a feature that is intended to be located on the condensation side of the heat pipe or vapor chamber, may induce a static water contact angle in the range of about 130° to 160°. In examples, the angle in the hydrophobic portion of the first substrate and/or feature surface may be about 130°, 140°, 150°, 160°, or within a range defined by any two of these examples.

In examples, on the surface of the first substrate and/or a feature that is intended to be located on the evaporation side of the heat pipe the surface chemical treatment may be avoided or exposure to the surface chemical treatment may be limited. In this manner, the hydrophilic characteristics of the oxidized surface in the evaporation side of the heat pipe may be maintained. In examples, the surface of the first substrate and/or a feature that is intended to be located on the evaporation side of the heat pipe may exhibit a static water contact angle in the range of about 5° to 50°. In examples, the angle in the hydrophilic portion of the substrate and/or feature surface may be about 5°, 10°, 15°, 20°, 25°, 30°, 35°, 40°, 45°, 50°, or within a range defined by any two of these examples.

Figure 2D:
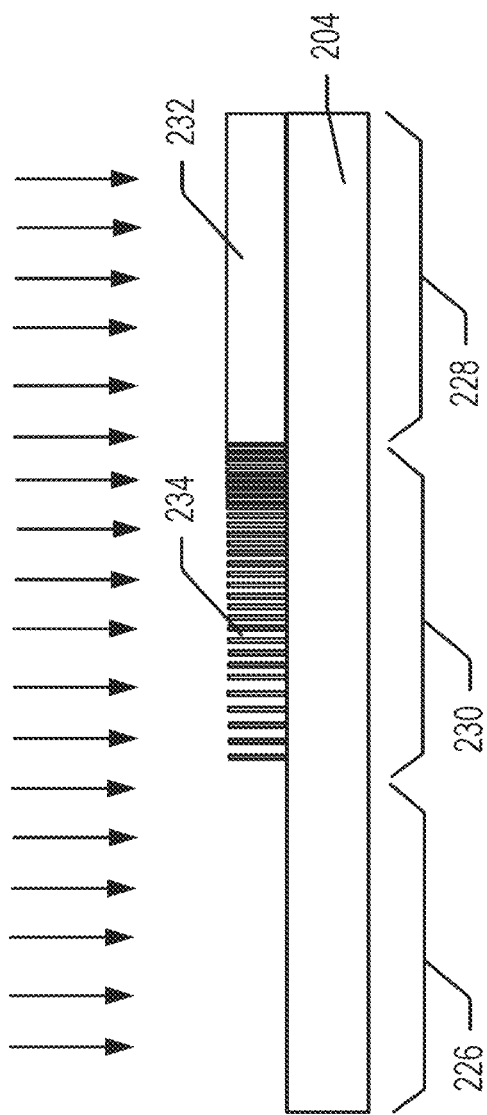
FIG. 2D is a simplified schematic diagram of a surface chemical treatment as described herein.

FIG. 2D is a cross-sectional view of the heat pipe 200 taken along line D-D in FIG. 2A. In examples, as shown in FIG. 2D a surface of first substrate 204 including any portions of the surface of one or more features formed thereon may be subject to different exposure to the surface chemical treatment over distinct portions or areas 226, 228, and 230. In examples, one or more features may extend across two or more portions or areas 226, 228, and 230 of the first substrate. For example, the portions or area 226, 228, and 230 of the first substrate 204 include at least a portion of the surface at the bottom portion 218 of one or more grooves or channels 206A, 206B, and/or 206C. As such, treatment of a portion or area of the first substrate may include treatment of the surface portion of the one or more features that extend in the treatment portion or area. In examples, treatment of a portion or area of the first substrate may include one or more masking steps, such as for example photolithographic masking, so that exposure to the surface chemical treatment of one or more portions of one or more surfaces of one or more features on the first substrate can be controlled.

In examples, a first portion or area 226 of the first substrate surface and/or any feature surface located in first portion or area 226 may be treated to enhance hydrophobicity, a second portion or area 228 of the first substrate surface and/or any feature surface located in second portion or area 228 may be left untreated or treated only to moderately modify hydrophilicity, and third portion or area 230 of the first substrate surface and/or any feature surface located in third portion or area 230 may be treated to achieve a transition region ranging from hydrophobic to hydrophilic.

In examples, the first and second portions or areas 226 and 228 of a substrate surface may correspond to two opposite end portions intended to correspond to the condensation and evaporation regions of the heat pipe or vapor chamber, while the third, transition region, may be a portion or area 230 of the substrate surface that lies between the first and second portions. In examples, more than three portions of the substrate surface may be exposed to the surface chemical treatment at different degrees and/or may be exposed to different surface chemical treatments. For example, the transition region at portion or area 230 may be subdivided into subregions with different exposures to achieve a more finite gradual transition from a hydrophobic surface to a hydrophilic surface.

As illustrated in FIG. 2D, one or more surface chemical treatments may be carried out while one or more portions or areas 226, 228, and 230 are exposed at varying degrees by a mask 232. In examples, mask 232 may be a photolithography mask that may be removed after the surface chemical treatments have been completed. As shown in FIG. 2D, mask 232 may be patterned to either fully or partially cover a portion or area. In examples, as illustrated, mask 232 may be patterned to cover portion or area 228 corresponding to the evaporation region of the heat pipe so as to prevent exposure of portion or area 228 to the surface chemical treatment. In examples, this can maintain the surface at portion or area 228 hydrophilic. In examples, also as illustrated, mask 232 may be patterned to fully expose portion or area 226 corresponding to the condensation region of the heat pipe so that a hydrophobic coating may be formed over portion or area 226. In examples, the surface chemical treatment may be carried out over all the portions or areas 226, 228, and 230 simultaneously. In examples, mask 232 may allow for at least some surface chemical treatment at the evaporation region.

In examples, post surface chemical treatment, the adiabatic region at transition portion or area 230 may exhibit a static water contact angle ranging from about 70° to about 120°. In examples, static water contact angle in the transition region may gradually increase from about 70° where the transition region is closest to the hydrophilic portion or area to about 120° where the transition region is closest to the hydrophobic portion or area. The transition region may be achieved via one or more photolithography masking steps with one or more surface chemical treatments.

In examples, as illustrated in FIG. 2D, a photolithography mask may be patterned to allow varying degrees of exposure across the adiabatic region to the surface chemical treatment from one end of the transition region to the other. In examples, increased exposure to the surface chemical treatment may result to formation of a hydrophobic coating over a greater portion of the adiabatic region. In examples, a photolithography mask may be patterned to cover more surface area over a first section of the transition region portion or area 230 than over a second section of the transition region portion or area 230.

For example, also as shown in FIG. 2D, mask 232 may be patterned to include one or more openings 234 exposing portion or area 230 corresponding to an adiabatic or transition region. In examples, the size or width of the openings 234 patterned in mask 232 over portion or area 230 may vary at different locations. In examples, as shown, mask 232 may be patterned to include smaller openings 234 over portion or area 230 that is closest to the evaporation region 228, than where it is closest to the condensation region 226. In this manner mask 232 may expose the portion or area 230 that is closest to the evaporation region 228 to the surface chemical treatment to a lower degree than where portion or area 230 is closest to the condensation region 226. In examples, the hydrophobicity of portion or area 230 may therefore be gradually increased moving from the evaporation region to the condensation region. In examples, mask 232 may be patterned in different manners. In examples, multiple masks 232 may be used to achieve a similar gradient exposure.

In examples, after the first substrate 204 has been laser ablated to form the one or more features, such as grooves or channels, oxidized, and at least in part exposed to the surface chemical treatment, it may be used to form a heat pipe or vapor chamber.

In examples, the one or more features formed in the first substrate may constitute at least a portion of the wick for a heat pipe or vapor chamber. In examples, the one or more features may constitute the whole wick for a heat pipe or vapor chamber.

Figure 2E:
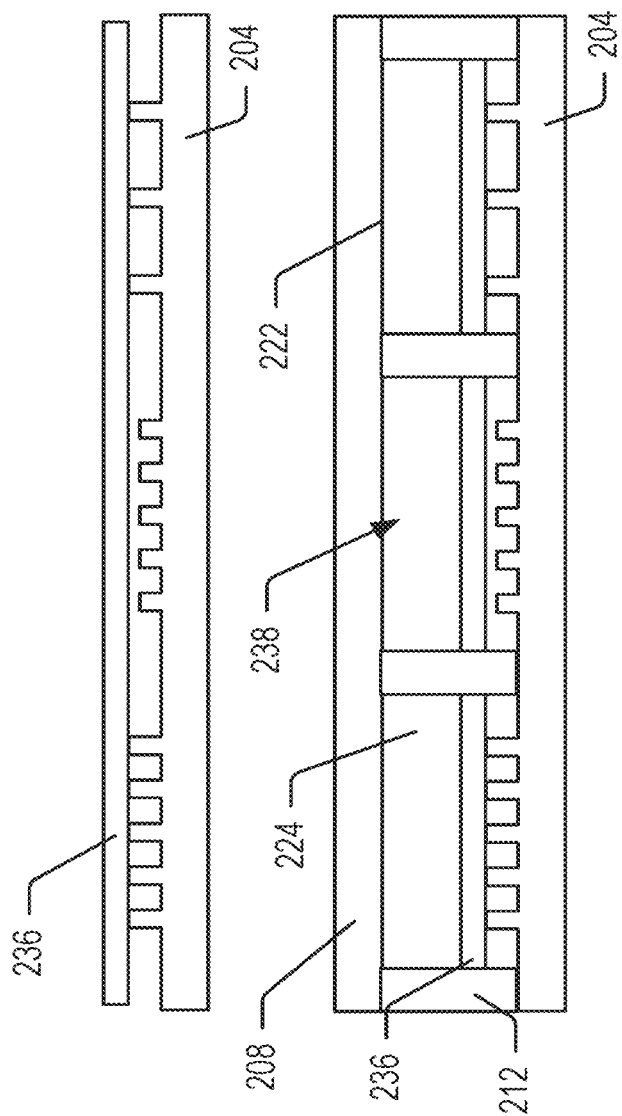
FIG. 2E shows simplified schematic diagrams from a same viewpoint as FIG. 2B of examples of heat pipes and processes of manufacturing the same including a wick layer structure in accordance with the present description.
Figure 2F:
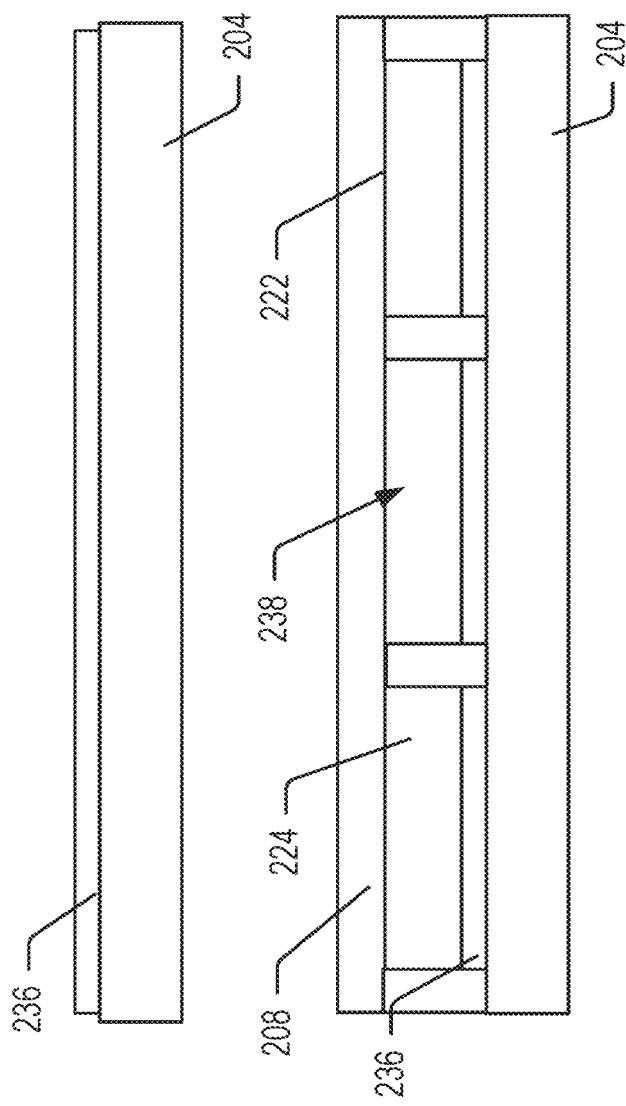
FIG. 2F shows simplified schematic diagrams from a same viewpoint as FIG. 2D of examples of heat pipes and processes of manufacturing the same including a wick layer structure in accordance with the present description.

In examples, an additional wick layer structure 236 may optionally be added to the treated surface of the first substrate 204, e.g., inserted into the heat pipe, to complete the wick for the heat pipe. FIGS. 2E and 2F illustrate example implementations of the additional wick layer structure 236. FIG. 2E is used to illustrate the example structure from the same view as FIG. 2B, and FIG. 2F is used to illustrate the example structure from the same view FIG. 2D. In examples, adding an additional wick layer structure may improve capillary limit, boiling limit, or both, of the heat pipe or vapor chamber.

In examples, the additional wick layer structure 236 may include any suitable material. In examples, the additional wick layer structure 236 may include polyimide, ceramic, glass, or any combination thereof. In examples, the additional wick layer structure 236 may be sintered or unsintered. In examples, the additional wick layer structure 236 may include a composite structure. In examples, the additional wick layer structure 236 may include woven wires such as a mesh, metal foams, sintered powders, one or more coatings, or any combinations thereof. In examples, the coating may be Al2O3/SiO2 bilayer. In examples, the mesh may include copper or copper alloy, nylon, or any combination thereof.

In examples, the additional wick layer structure 236 may include an unsintered 100-mesh copper screen. In examples, the additional wick layer structure 236 may include a sintered 100-mesh copper screen with a liquid/vapor interface covered with nickel powder. In examples, the additional wick layer structure 236 may include a sintered 100-mesh copper screen with a wall/wick and liquid/vapor interface covered with nickel powder. In examples, the additional wick layer structure 236 may include a sintered 100-mesh copper screen, lightly covered with nickel powder throughout its structure.

In examples, the additional wick layer structure 236 may include a nanostructure. In examples, an additional wick layer structure can exhibit improved thermal properties that may be advantageous at least in the evaporation section of the heat pipe or vapor chamber. In examples, the nanostructure may be combined with hydrophilic carbon nanotubes (CNT) grown on the surface of the additional wick layer structure particles. In examples, the CNT may provide an enhance additional wick layer structure pores for enhanced permeability and evaporation characteristics.

In examples, the additional wick layer structure may include sintered copper with one or more micro grooves. In examples, the sintered copper structure may be provided at least in the evaporation section of the heat pipe or vapor chamber. In examples, the micro groove additional wick layer structure may be configured to provide passages for vapor to escape from the heated surface while maintaining continuous aligned channels for liquid delivery and thus may facilitate the boiling heat transfer at high heat fluxes.

In examples, the additional wick layer structure 236 may be affixed to the first substrate 204 over the one or more features, such as grooves or channels, previously described as ablated into the first substrate 204. In examples, the additional wick layer structure 236 may be secured to the first substrate 204 via bonding by any suitable means. In examples, the additional wick layer structure 236 may be bonded to the first substrate 204 by spot welding, thermal compression, or like process.

In examples, the first substrate 204 may be coupled (e.g., welded, direct bonded, etc.) to a second substrate 208 or cover, e.g., second substrate 108 of FIGS. 1A-1D, by sidewalls 210 along the elongated sides and by endcaps 214 (shown in FIG. 2C) at the longitudinal ends, thereby forming a void or cavity in the interior of the heat pipe 200.

In examples, the second substrate 208 or cover may be a substrate made of the same or similar material as described for the first substrate. Thus, in examples, the second substrate 208 may include polyimide. In examples, the second substrate 208 may include an internal surface 222. In examples, the internal surface 222 of the second substrate 208 may be configured to face the treated ablated surface of the first substrate, the one or more features on the first substrate, and/or the additional wick layer structure 236 when the second substrate 208 is bonded to the first substrate 204. In examples, the internal surface 222 of the second substrate 208 may be free of any features, such as grooves or channels, and/or be free of any additional wick structure. In examples, the internal surface 222 of the second substrate 208 may be a flat surface. In examples, the internal surface 222 of the second substrate 208 may be a polished surface.

Any suitable means may be used to connect the first substrate to the second substrate. In examples, the first substrate may be connected to the second substrate via any suitable means such as one or more fasteners, welding, adhesive, or the like. In examples, fasteners may include screes, pins, brackets, fittings, or like structures.

In examples where the first substrate 204 is welded to the second substrate 208, an optional thin perimeter border of copper (Cu) may be disposed around perimeters of the first polyimide substrate 204 and the second polyimide substrate 208. The metal-to-metal bonding when the first substrate 204 is connected to the second substrate 208 may help with the seal between the first substrate 204 and the second substrate 208. The copper may take the heat and minimize degradation of the polyimide.

In examples, the heat pipe 200 may include an atomic layer deposition (ALD) coating or a chemical vapor deposition (CVD) coating on the exterior and/or interior, i.e., on the first substrate 204 and the second substrate 208. The ALD coating or CVD coating may serve as a moisture barrier.

In examples, when the second substrate 208 is connected to the first substrate 204, one or more spacers 212 may be interposed between the first and second substrates so that an internal space 224 may be defined and enclosed between the first and second substrates. In examples, the internal space 224 may be sufficiently large to house the additional wick layer structure 236. In examples, the internal space 224 is sufficiently large to house the additional wick layer structure 236 and also include a headspace 238 between the additional wick layer structure 236 and the second substrate internal surface 222.

As shown in FIG. 2C, spacers 212 or other supports may be disposed at one or more intermediate locations in the interior of the heat pipe 200 to maintain a uniform spacing between the first substrate 204 and the second substrate 208. The number, position, and spacing of the spacers 212 may vary depending on the size of the heat pipe 200, the thickness of the first substrate 204 and/or second substrate 208, and the like. The spacers 212 may be affixed to the first substrate 204, the second substrate 208, or both.

In examples, once the second substrate 208 or cover has been secured to the first substrate 204, the heat pipe may be charged with a working fluid. In examples, the fill ratio and the nature of the working fluid may affect the power, Qmax, of the heat pipe or vapor chamber.

Upon assembly of a heat pipe or vapor chamber, the interior of the heat pipe may be evacuated to obtain a near vacuum (e.g., having pressure less than about $10^{-3}$ Torr in some examples). In examples, a small amount of water or other working fluid (e.g., 0.1 grams to 1 gram in some examples) may be introduced into the interior of the heat pipe or vapor chamber. In examples, the working fluid may be introduced after the heat pipe has been evacuated to near vacuum.

In examples, a charge orifice 202 as illustrated in FIG. 2A may be provided at one surface of heat pipe 200 to provide fluid access to an interior of the heat pipe 200. A valve may be positioned in the charge orifice 202 to hermetically seal the charge orifice. Upon assembly of the heat pipe 200, the interior of the heat pipe may be evacuated to obtain a near vacuum (e.g., having pressure less than about $10^{-3}$ Torr in some examples) and a small amount of water or other working fluid (e.g., 0.1 grams to 1 gram in some examples) may be introduced into the interior of the heat pipe 200.

In examples, the heat pipe may be charged with a working fluid at varying levels. In examples, charging of the working fluid may be accomplished by injecting a working fluid through at least the charge orifice. The amount of working fluid injected into the heat pipe may be as desired. In examples, the heat pipe is charged at 100% of its configured capacity, below 100% of its configured capacity, or above 100% of its configured capacity. In examples, the fill ratio may be set based on desired performance of the heat pipe or vapor chamber. For example, undercharging the heat pipe to below 100% of its configured capacity may decrease Qmax, but may improve thermal resistance. In contrast, overcharging the heat pipe to above 100% of its configured capacity may increase Qmax, but may worsen thermal resistance.

In examples, the working fluid may be water, acetone, ammonia, glycol/water solution, dielectric coolants, alcohols, liquid nitrogen, mercury, magnesium, potassium, sodium, lithium, silver, methanol, or any combination thereof.

In examples, once the heat pipe 200 is finished, or during manufacture of the heat pipe, one or more antennas, e.g., antennas 112 of FIGS. 1A-1D, may be added to an outer surface of the first substrate 204, the second substrate 208, or both, as previously described herein. Alternatively, prior to manufacture of the heat pipe 200, one or more antennas, e.g., antennas 112 of FIGS. 1A-1D, may be added to an outer surface of the first substrate 204, the second substrate 208, or both, as previously described herein.

Example Devices Including a Heat Pipe or Vacuum Chamber

Figure 3A:
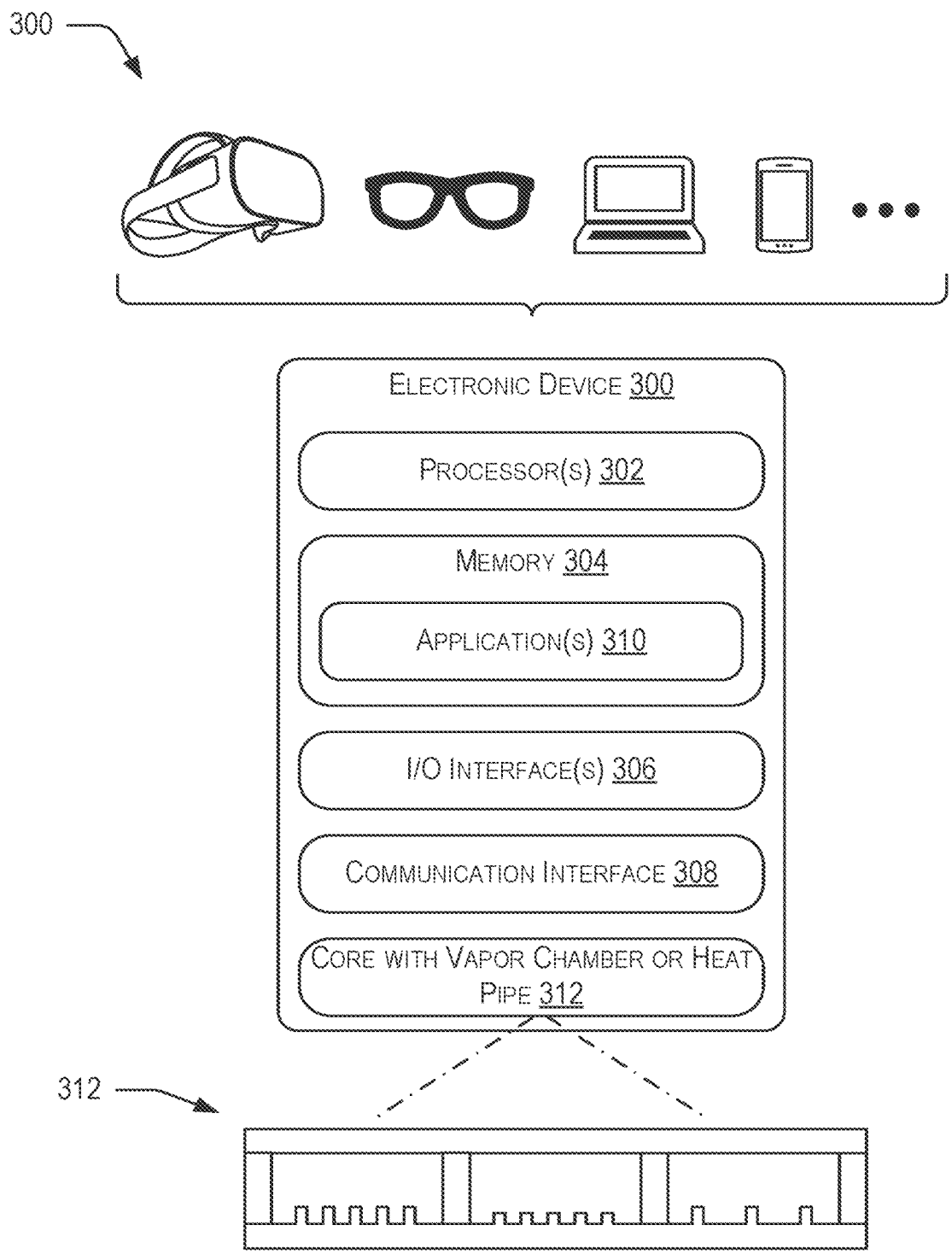
FIGS. 3A and 3B are simplified schematic diagrams of example structures incorporating a heat pipe, in accordance with examples of the present disclosure.

FIG. 3A illustrates an example electronic device 300 in which a heat pipe, e.g., heat pipe 100 of FIGS. 1A-1D and heat pipe 200 of FIGS. 2A-2F, as manufactured in accordance with this description may be employed. The electronic device 300 may be representative of a head-mounted device, such as an extended reality visor or glasses, a laptop computer, a mobile device such as a tablet or mobile phone, or any other electronic device such as those described throughout this application. As shown, the electronic device 300 includes one or more electronic components such as processors 302, memory 304, input/output interfaces 306 (or "I/O interfaces 306"), and communication interfaces 308, which may be communicatively coupled to one another by way of a communication infrastructure (e.g., a bus, traces, wires, etc.). While the electronic device 300 is shown in FIG. 3A having a particular configuration, the components illustrated in FIG. 3A are not intended to be limiting. The various components can be rearranged, combined, and/or omitted depending on the requirements for a particular application or function. Additional or alternative components may be used in other examples.

In some examples, the processor(s) 302 may include hardware for executing instructions, such as those making up a computer program or application. For example, to execute instructions, the processor(s) 302 may retrieve (or fetch) the instructions from an internal register, an internal cache, the memory 304, or other computer-readable media, and decode and execute them. By way of example and not limitation, the processor(s) 302 may comprise one or more central processing units (CPUs), graphics processing units (GPUs), holographic processing units, microprocessors, microcontrollers, integrated circuits, programmable gate arrays, or other hardware components usable to execute instructions.

The memory 304 is an example of computer-readable media and is communicatively coupled to the processor(s) 302 for storing data, metadata, and programs for execution by the processor(s) 302. In some examples, the memory 304 may constitute non-transitory computer-readable media such as one or more of volatile and non-volatile memories, such as Random-Access Memory ("RAM"), Read-Only Memory ("ROM"), a solid-state disk ("SSD"), Flash, Phase Change Memory ("PCM"), or other types of data storage. The memory 304 may include multiple instances of memory, and may include internal and/or distributed memory. The memory 304 may include removable and/or non-removable storage. The memory 304 may additionally or alternatively include one or more hard disk drives (HDDs), flash memory, Universal Serial Bus (USB) drives, or a combination these or other storage devices.

As shown, the electronic device 300 includes one or more I/O interfaces 306, which are provided to allow a user to provide input to (such as touch inputs, gesture inputs, keystrokes, voice inputs, etc.), receive output from, and otherwise transfer data to and from the electronic device 300. Depending on the particular configuration and function of the electronic device 300, the I/O interface(s) 306 may include one or more input interfaces such as keyboards or keypads, mice, styluses, touch screens, cameras, microphones, accelerometers, gyroscopes, inertial measurement units, optical scanners, other sensors, controllers (e.g., handheld controllers, remote controls, gaming controllers, etc.), network interfaces, modems, other known I/O devices or a combination of such I/O interface(s) 306. Touch screens, when included, may be activated with a stylus, finger, thumb, or other object. The I/O interface(s) 306 may also include one or more output interfaces for presenting output to a user, including, but not limited to, a graphics engine, a display (e.g., a display screen, projector, holographic display, etc.), one or more output drivers (e.g., display drivers), one or more audio speakers, and one or more audio drivers. In certain examples, I/O interface(s) 306 are configured to provide graphical data to a display for presentation to a user. The graphical data may be representative of one or more graphical user interfaces and/or any other graphical content as may serve a particular implementation. By way of example, the I/O interface(s) 306 may include or be included in a wearable device, such as a head-mounted display (e.g., headset, glasses, helmet, visor, etc.), a suit, gloves, a watch, or any combination of these, a handheld electronic device (e.g., tablet, phone, handheld gaming device, etc.), a portable electronic device (e.g., laptop), or a stationary electronic device (e.g., desktop computer, television, set top box, a vehicle electronic device). In some examples, the I/O interface(s) 306 may be configured to provide an extended reality environment or other computer-generated environment.

The electronic device 300 may also include one or more communication interface(s) 308. The communication interface(s) 308 can include hardware, software, or both. In examples, communication interface(s) 308 may provide one or more interfaces for physical and/or logical communication (such as, for example, packet-based communication) between the electronic device 300 and one or more other electronic devices or one or more networks. As an example, and not by way of limitation, the communication interface(s) 308 may include a network interface controller (NIC) or network adapter for communicating with an Ethernet or other wire-based network and/or a wireless NIC (WNIC) or wireless adapter for communicating with a wireless network, such as a WI-FI adapter. In examples, communication interface(s) 308 can additionally include a bus, which can include hardware (e.g., wires, traces, radios, etc.), software, or both that communicatively couple components of electronic device 300 to each other. In examples, the electronic device 300 may include additional or alternative components that are not shown, such as, but not limited to, a power supply (e.g., batteries, capacitors, etc.), a housing or other enclosure to at least partially house or enclose the chassis and/or any or all of the components.

The memory 304 may store one or more applications 310, which may include, among other things, an operating system (OS), productivity applications (e.g., word processing applications), communication applications (e.g., email, messaging, social networking applications, etc.), games, or the like. The application(s) 310 may be implemented as one or more stand-alone applications, as one or more modules of an application, as one or more plug-ins, as one or more library functions application programming interfaces (APIs) that may be called by other applications, and/or as a cloud-computing model. The application(s) 310 can include local applications configured to be executed locally on the electronic device, one or more web-based applications hosted on a remote server, and/or as one or more mobile device applications or "apps."

In examples, the electronic device 300 may also include a core 312 including one or more heat pipes to which the other electronic components such as the processor(s) 302, memory 304, I/O interface(s) 306, and/or communication interface(s) 308 can be coupled. In examples, the heat pipe may be formed integrally with the core 312 and may be configured to dissipate and/or spread heat generated by the one or more other components.

In examples, the heat pipe of the core 312 can be made according to the techniques described herein, and may be configured to exhibit manufacturing tolerances suitable for mounting precision optical components (e.g., lenses, display screens, mirrors, gratings, optical fibers, light pipes, etc.).

Figure 3B:
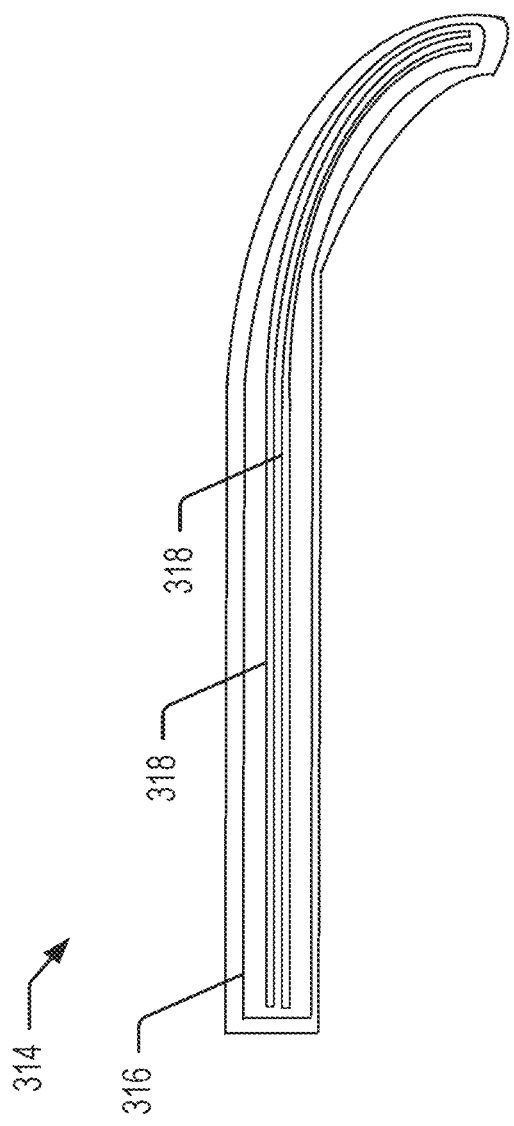

Referring to FIG. 3B, an example of a temple arm 314 of an electronic device 300 in the form of glasses is illustrated. The temple arm 314 includes a heat pipe 316, e.g., heat pipe 100 of FIGS. 1A-1D and heat pipe 200 of FIGS. 2A-2F, that is shaped to fit the temple arm 314 and includes multiple antennas 318, e.g., antennas 112 of FIG. 1A-1D, on the surface of the heat pipe 316. In the example of FIG. 3B, the heat pipe 316 and antennas 318 are located at an outer portion of the arm 314, e.g., the portion of the arm 314 that is not adjacent to a user's head.

Example Method

FIG. 4 illustrates a flow diagram of an example method 400 that illustrates aspects of techniques as described herein. It should be appreciated that more or fewer operations might be performed than shown in FIG. 4 and described herein. These operations can also be performed in parallel, or in a different order than those described herein.

FIG. 4 schematically illustrates an example method 400 of manufacturing a heat pipe, e.g., heat pipe 100 or 200, that includes one or more antennas disposed on the heat pipe.

At 402, a heat pipe comprising polyimide is provided. In some examples, the heat pipe 100 that comprises a first substrate 104 and a second substrate (cover) 108 is provided. In examples, at least the second substrate 108 comprises polyimide. In some embodiments, the first substrate 104 also comprises polyimide.

At 404, an antenna portion is created. In configurations, creating an antenna portion comprises providing a radio frequency (RF) compatible thin film and disposing an antenna on the RF compatible thin film. For example, an antenna portion 124 that includes one or more antennas 112 may be created. In such examples, the antenna portion 124 may include providing a radio frequency (RF) compatible thin film 128 and disposing the one or more antennas 112 on the RF compatible thin film 128. In some examples, the one or more antennas 112 may be disposed on the RF compatible thin film 128 by printing the one or more antennas 112 on a surface of the RF compatible thin film 128. In other examples, the one or more antennas 112 may be disposed on the RF compatible thin film 128 by laminating the one or more antennas 112 on the RF compatible thin film 128 on a surface of the RF compatible thin film 128. In some examples, the one or more antennas 112 may be disposed on the RF compatible thin film 128 by chemically etching the one or more antennas 112 into a surface of the RF compatible thin film 128

At 406, the antenna portion is disposed on an outer surface of the heat pipe. For example, the antenna portion 124 may be attached to the outer surface 116 of the heat pipe 100, e.g., the outer surface 116 of the second substrate 108.

CONCLUSION

Although the discussion above sets forth example implementations of the described techniques, other architectures may be used to implement the described functionality and are intended to be within the scope of this disclosure.

Furthermore, although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A wearable device comprising at least one heat pipe, wherein the at least one heat pipe comprises:
   a first substrate comprising a plurality of raised features configured to form groups of channels separated by spacers on a surface of the first substrate;
   an evaporator portion;
   a condenser portion formed over the groups of channels;
   a second substrate bonded to the first substrate;
   a working fluid between the first substrate and the second substrate; and
   an antenna disposed on an outer surface of one of the first substrate or the second substrate,
   wherein the antenna comprises a linear antenna, and wherein at least one of the first substrate or the second substrate comprises polyimide.

2. The wearable device of claim 1, further comprising: a dielectric material on the at least one heat pipe, wherein the antenna is disposed on the dielectric material.

3. The wearable device of claim 2, wherein the dielectric material comprises polythene.

4. The wearable device of claim 2, wherein the dielectric material comprises polypropylene.

5. The wearable device of claim 1, wherein the antenna comprises: a radio frequency (RF) compatible thin film.

6. The wearable device of claim 1, further comprising:
   one or more stiffening layers on portions of the at least one heat Pipe,
   wherein the antenna is disposed on the one or more stiffening layers.

7. The wearable device of claim 6, wherein the one or more stiffening layers comprise polythene.

8. The wearable device of claim 6, wherein the one or more stiffening layers comprise polypropylene.

9. A heat pipe comprising:
   a first substrate comprising a plurality of raised features configured to form groups of channels separated by spacers on a surface of the first substrate;
   an evaporator portion;
   a condenser portion formed over the groups of channels;
   a second substrate bonded to the first substrate;
   a working fluid between the first substrate and the second substrate; and
   an antenna disposed on an outer surface of one of the first substrate or the second substrate,
   wherein at least one of the first substrate or the second substrate comprises polyimide.

10. The heat pipe of claim 9, further comprising:
    a dielectric material on the heat pipe, wherein the antenna is disposed on the dielectric material.

11. The heat pipe of claim 10, wherein the dielectric material comprises polythene.

12. The heat pipe of claim 10, wherein the dielectric material comprises polypropylene.

13. The heat pipe of claim 9, wherein the antenna comprises: a radio frequency (RF) compatible thin film.

14. The heat pipe of claim 9, further comprising:
    one or more stiffening layers on portions of the heat pipe,
    wherein the antenna is disposed on the one or more stiffening layers.

15. A heat dissipating apparatus comprising:
    a first substrate comprising a plurality of raised features configured to form channels on a surface of the first substrate;
    an evaporator portion;
    a condenser portion;
    a second substrate bonded to the first substrate;
    a working fluid between the first substrate and the second substrate; and
    an antenna disposed on an outer surface of one of the first substrate or the second substrate,
    wherein the antenna comprises a linear antenna, and wherein at least one of the first substrate or the second substrate comprises polyimide.

16. The heat dissipating apparatus of claim 15, further comprising:
    a dielectric material on the heat dissipating apparatus, wherein the antenna is disposed on the dielectric material.

17. The heat dissipating apparatus of claim 16, wherein the dielectric material comprises polythene.

18. The heat dissipating apparatus of claim 16, wherein the dielectric material comprises polypropylene.

19. The heat dissipating apparatus of claim 15, wherein the antenna comprises:
    a radio frequency (RF) compatible thin film.

20. The heat dissipating apparatus of claim 15, further comprising:
    one or more stiffening layers on portions of the heat dissipating apparatus,
    wherein the antenna is disposed on the one or more stiffening layers.

* * * * *